US011954031B2

(12) United States Patent
Symons et al.

(10) Patent No.: US 11,954,031 B2
(45) Date of Patent: *Apr. 9, 2024

(54) ENHANCING CACHE DIRTY INFORMATION

(71) Applicant: Kioxia Corporation, Tokyo (JP)

(72) Inventors: David Symons, Abingdon (GB); Ezequiel Alves, Abingdon (GB)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/888,292

(22) Filed: Aug. 15, 2022

(65) Prior Publication Data

US 2023/0023940 A1    Jan. 26, 2023

Related U.S. Application Data

(63) Continuation of application No. 17/200,149, filed on Mar. 12, 2021, now Pat. No. 11,449,423.

(51) Int. Cl.
  *G06F 12/08* (2016.01)
  *G06F 12/0804* (2016.01)
  *G11C 14/00* (2006.01)

(52) U.S. Cl.
  CPC .. *G06F 12/0804* (2013.01); *G06F 2212/1032* (2013.01); *G11C 14/0018* (2013.01)

(58) Field of Classification Search
  CPC ............... G06F 12/0804; G06F 12/0808
  USPC ........................................................ 711/144
  See application file for complete search history.

(56) References Cited

U.S. PATENT DOCUMENTS

| 10,019,362 | B1  |   | 7/2018  | Chatterjee et al. |              |
|------------|-----|---|---------|-------------------|--------------|
| 11,449,423 | B1  | * | 9/2022  | Symons            | G06F 12/0246 |
| 2016/0266793 | A1 |   | 9/2016  | Saito et al.      |              |
| 2017/0199687 | A1 | * | 7/2017  | Kohara            | G06F 12/0246 |
| 2018/0107596 | A1 |   | 4/2018  | Kelly et al.      |              |
| 2020/0371927 | A1 | * | 11/2020 | Chachad           | G06F 12/0811 |
| 2020/0371970 | A1 | * | 11/2020 | Chachad           | G06F 13/1605 |
| 2021/0097000 | A1 |   | 4/2021  | Dutta             |              |
| 2021/0157736 | A1 | * | 5/2021  | Bavishi           | G06F 12/0895 |
| 2021/0294738 | A1 |   | 9/2021  | Tadokoro          |              |

OTHER PUBLICATIONS

Jeong et al (Improving Flash Storage Performance by Caching Address Mapping Table in Host Memory (Year: 2017).*

* cited by examiner

*Primary Examiner* — Than Nguyen
(74) *Attorney, Agent, or Firm* — Foley & Lardner LLP

(57) ABSTRACT

A method performed by a controller comprising assigning a first status indicator to entries in a first address line in a volatile memory belonging to a first region of an LUT stored in a non-volatile memory, and a second status indicator to entries in the first address line in the volatile memory belonging to a second region of the LUT, setting either the first or second status indicator to a dirty status based on whether a cache updated entry at an address m in the volatile memory belongs to the first or second region of the LUT, and writing, based on the dirty status of the first and second status indicator at the address m, all entries in the volatile memory associated with the first region or the second region containing the updated entry to the non-volatile memory.

30 Claims, 6 Drawing Sheets

ENHANCING CACHE DIRTY INFORMATION

CROSS-REFERENCE TO RELATED APPLICATIONS

This application is a continuation of U.S. application Ser. No. 17/200,149 filed on Mar. 12, 2021, the entire contents of which are incorporated herein by reference.

FIELD

The present disclosure relates to solid-state drives (SSD) and methods that enhance dirty information in cache lines to efficiently update logical-to-physical (L2P) addressing, and thus the performance of the SSD.

BACKGROUND

A solid-state drive (SSD) generally has faster performance, is more compact, and is less sensitive to vibration or physical shock than a conventional magnetic disk drive. Given these advantages, SSDs are being used in more and more computing devices and other consumer products in lieu of or in addition to magnetic disk drives, even though the cost-per-gigabyte storage capacity of SSDs is significantly higher than that of magnetic disk drives. SSDs utilize physical memory cells that comprise non-volatile semiconductor storage devices, such as NAND memory devices, to store data. A controller is used in an SSD to manage the transfer of data between a host and the memory cells of the SSD. Writing data to and reading data from the physical memory cells of an SSD typically involves transferring data between a host external to the SSD and the nonvolatile semiconductor storage devices.

SSDs are subject to large volumes of data traffic as they receive multiple read and write requests from the host. Such host requests are in the form of commands that include logical address information, such as logical block addresses (LBAs) and namespace identifiers (NSIDs), which the SSD converts to a physical address (e.g. a NAND memory page address) in the non-volatile semiconductor storage devices. The SSD converts a logical address in a host command to a physical address in the non-volatile semiconductor storage devices by accessing a look-up table (LUT). The LUT maps a logical address in a namespace to a physical address in the non-volatile semiconductor storage device. The SSD then uses the physical address to fulfill the request (e.g. a read of data from the non-volatile semiconductor storage devices). Typically the LUT is very large, approximately 1/1000th of the capacity of the SSD, and is stored in the non-volatile semiconductor storage device. In order for the SSD to convert a logical address to a physical address when processing a host request, the LUT is loaded into volatile memory within the SSD for fast access.

Read and write commands from the host, as well as internal processing within the SSD (such as garbage collection) may result in changes to the addresses stored in the LUT. The SSD cache updates the LUT in the volatile memory during processing of a host request. These updates are then stored to the non-volatile semiconductor storage device periodically so that the changes in the LUT are saved before power to the volatile memory is lost. However due to the large size of the LUT, such updates may lead to increased latency of the SSD due to the writing of large amounts of data from the volatile to the non-volatile semiconductor storage device. Further, if such updates are not stored in the non-volatile semiconductor storage device before power is lost, updated address information may be lost, leading to errors and possibly failure of the SSD. This imposes a challenges on how to efficiently manage updates of a logical-to-physical LUT in the non-volatile semiconductor storage device.

SUMMARY

According to an embodiment of the present disclosure there is provided a memory storage system comprising a non-volatile semiconductor memory device configured to store a look-up table (LUT) comprising entries grouped into at least one first region and at least one second region. The memory storage system also comprises a volatile semiconductor memory device configured to temporarily store the entries of the LUT from the non-volatile semiconductor memory device. Further the memory storage system comprises a controller configured to store and retrieve data in the non-volatile semiconductor memory device in response to commands received from a host external to the memory storage system, the controller comprising a cache comprising a plurality of cache lines communicatively coupled to the volatile semiconductor memory device and configured to temporarily store in a cache line z of the plurality of cache lines entries read from an address m of a plurality of addresses of the volatile semiconductor device.

The controller is configured to assign a first status indicator and a second status indicator to each of the plurality of cache lines in the cache corresponding to a plurality of cached addresses of the volatile semiconductor memory device, the first status indicator corresponding to entries of a first cached address of the volatile semiconductor memory device belonging to the first region of the LUT, and the second status indicator corresponding to entries of the first cached address of the volatile semiconductor memory device belonging to the second region of the LUT. The controller is also configured to update an entry of the LUT at the address m in the volatile semiconductor memory device read into the cache line z of the cache. Additionally, the controller is configured to set either the first status indicator or the second status indicator to a dirty status based on whether an updated entry in the cache line z read from the address m is in the first region or the second region of the LUT, respectively. Further, the controller is configured to copy, based on the dirty status of the first status indicator or the second status indicator of the cache line z, all entries in the volatile semiconductor memory device associated with the first region or the second region containing the updated entry to the non-volatile semiconductor memory device.

According to another embodiment of the present disclosure there is provided a method performed by a controller of a memory storage system comprising a non-volatile semiconductor memory device configured to store a look-up table (LUT) comprising entries grouped into at least one first region and at least one second region. The memory storage system also comprises a volatile semiconductor memory device configured to temporarily store the entries of the LUT from the non-volatile semiconductor memory device. Further, the memory system comprises a cache comprising a plurality of cache lines communicatively coupled to the volatile semiconductor memory device and configured to temporarily store in a cache line z of the plurality of cache lines entries read from an address m of a plurality of address lines of the volatile semiconductor device.

The method comprises assigning a first status indicator and a second status indicator to each of the plurality of cache lines in the cache corresponding to a plurality of cached addresses of the volatile semiconductor memory device, the first status indicator assigned to entries of a first cached address of the volatile semiconductor memory device belonging to the first region of the LUT, and the second status indicator assigned to entries of the first cached address of the volatile semiconductor memory device belonging to the second region of the LUT. The method also comprises updating an entry of the LUT at the address m in the volatile semiconductor memory device read into the cache line z of the cache. Additionally, the method comprises setting either the first status indicator or the second status indicator to a dirty status based on whether an updated entry in the cache line z read from the address m is in the first region or the second region of the LUT, respectively. Further, the method comprises copying, based on the dirty status of the first status indicator or the second status indicator of the cache line z, all entries in the volatile semiconductor memory device associated with the first region or the second region containing the updated entry to the non-volatile semiconductor memory device.

In some implementations, the controller is further configured to read the entry of the LUT at address m to the cache line z, and write the cache line z back to address m of the volatile semiconductor memory device. In certain implementations, the controller is configured to update only one entry of the LUT in the cache at a time. In further implementations, the controller is configured to repeatedly update entries of the LUT in the volatile semiconductor memory device via the cache based on commands received from the host.

In certain implementations, the LUT maps a logical cluster address (LCA) to a media cluster address (MCA) in the non-volatile semiconductor memory device. In further implementations, the non-volatile semiconductor memory device is configured to store a second LUT which maps an index associated with each of the at least one first region and the at least one second region to a media cluster address (MCA) in the non-volatile semiconductor memory device. In other implementations, the controller is configured to access the second LUT to determine a starting MCA address of the region containing the updated entry in the non-volatile semiconductor memory device. In some implementations, the controller is configured to copy the LUT from the non-volatile semiconductor memory device to the volatile semiconductor memory device when the memory storage system first starts up.

In further implementations, the first and second status indicators each comprise a bit. In other implementations, each bit is set to a clean status before the entry of the LUT at the address m is updated in the cache. In some implementations, the controller sets the bit to '0' for the clean status, and sets the bit to '1' for the dirty status. In certain implementations, the cache comprises a write back cache. In some implementations, the cache is formed in a portion of the volatile semiconductor memory device. In other implementations, the non-volatile semiconductor memory device is a NAND semiconductor memory. In further implementations, the volatile semiconductor memory device is a Dynamic Random Access Memory (DRAM). In some implementations, the cache comprises a Static Random Access Memory (SRAM). In certain implementations, the controller comprises a system-on-chip (SoC) controller. In other implementations, at least a portion of the volatile semiconductor memory device is external to the SoC controller.

BRIEF DESCRIPTION OF DRAWINGS

The foregoing and other objects and advantages will be apparent upon consideration of the following detailed description, taken in conjunction with the accompanying drawings, in which like reference characters refer to like parts throughout, and in which.

DETAILED DESCRIPTION

Figure 1:
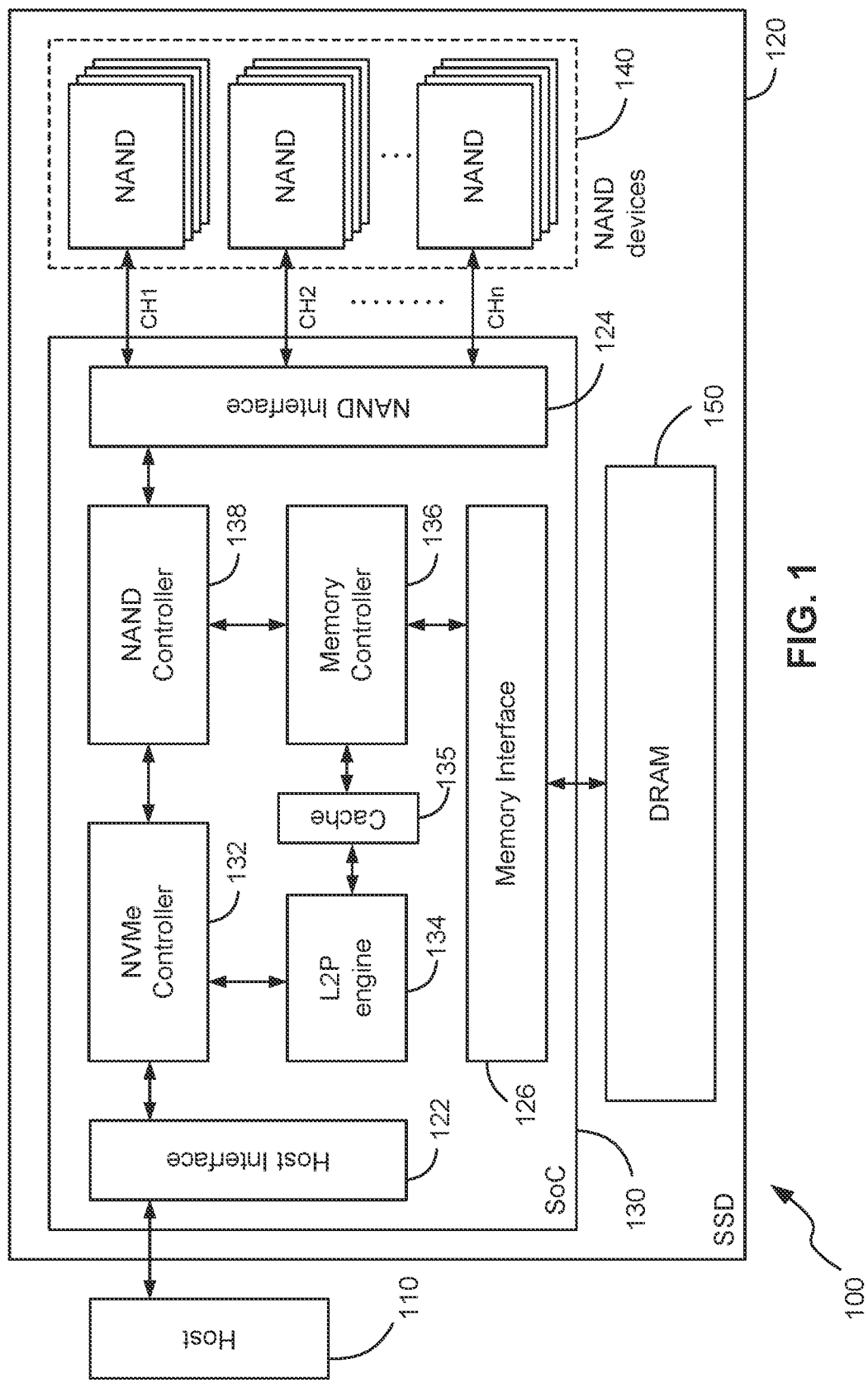
FIG. 1 shows a schematic representation of an SSD, configured according to one or more embodiments of the present disclosure.

To provide an overall understanding of the devices described herein, certain illustrative embodiments will be described. Although the embodiments and features described herein are specifically described for use in connection with an SSD having a controller, it will be understood that all the components and other features outlined below may be combined with one another in any suitable manner and may be adapted and applied to other types of SSD architectures with memories having a similar need to efficiently update a look-up table stored in the semiconductor storage device of the SSD when processing commands from a host.

Hitherto, the non-volatile memory of the SSD (e.g. NAND flash memory devices) stores a logical cluster address (LCA) to a media cluster address (MCA) LUT in regions that are indexed from zero, often referenced as even regions and odd regions. Each entry in the LUT includes a MCA which corresponds to a translation between an LCA and an MCA, and when data at an LCA is over-written with new data by the host, the new data is written to a new MCA, necessitating an update to the corresponding LUT entry. During processing of host commands, the SSD controller loads the LCA-MCA LUT stored in the non-volatile memory of the SSD to a volatile memory in the SSD (e.g. Dynamic Random Access Memory (DRAM)) for quick access by the cache (e.g. Static Random Access Memory (SRAM)). Each read access to the LCA-MCA LUT in the volatile memory comprises a DRAM burst of data which is temporarily stored in a cache line. Each cache line corresponds to a DRAM burst's worth of data read from a DRAM address. The cache acts as a write-back cache, where updates are applied to LUT entries in the cache line, and the entire cache line is then written back to the DRAM address associated with the cache line when it was first read from DRAM memory. After being updated by the controller, the updates to entries in the LCA-MCA LUT in the DRAM are subsequently flushed back to the NAND memory so that the updated LCA-MCA LUT will be available should power be cut from the SSD (where the DRAM and SRAM will lose data). In order to limit the amount of data flushed per update, the flushes are conducted on a per-region basis, where a region consisting of a group of 32, 64 or 128 LUT entries (which may be configurable and dependent on the total storage size of the SSD) is flushed at any one time. During the flush of data from the DRAM to the NAND memory, entire regions containing updates are copied over to the NAND memory for quick update.

However, the amount of data transferred between the DRAM and SSD controller must always be a full DRAM burst, which is dictated by the DRAM data bus width and DRAM data bus burst length, such that the cache lines are arranged to be aligned to DRAM burst boundaries. The LCA-MCA LUT is an enormous table (typically of the order of Gigabytes), and each entry, an MCA, may be an inconvenient (e.g. odd, or non-power-of-2) number of bits (dependent on the size of the SSD capacity, e.g. 33 bits for a 16 TB SSD) to fit into word-aligned memory and in addition there may be additional ECC bits added per DRAM burst, such that the LUT entries are packed as tightly as possible to conserve DRAM. This means that an individual MCA entry will generally be within one DRAM burst, but it is also possible that a MCA entry may span two DRAM bursts. This results in cache lines that span either an even LUT region, an odd LUT region, or both. The controller associates a single bit with each cache line to track updates to the entries of the LCA-MCA LUT. The LCA-MCA LUT contained in the DRAM is copied to the cache in a DRAM burst for updating by the cache during processing of host commands. Such a DRAM burst copies a single DRAM burst to a cache line at any one time to the SRAM. The LCA-MCA LUT data in the cache line is updated and subsequently written back to the DRAM. The single bit is set to dirty when there is a change to the information contained in the cache line based on any changes to the mapping of LCA to MCA by the SSD controller. For example the single bit is set to '1' when there is a change to an entry in the LCA-MCA LUT data contained in the cache line.

However due to the packing of LUT entries in the DRAM, there may be cache lines that span two neighboring LUT regions. In such a situation, when there is an update in one region and not in the neighboring region, the single dirty bit from the cache line will not be sufficient to identify which of the two regions contains an update. Therefore, both regions would need to be flushed to NAND and as each region comprises a plurality of entries, the controller unnecessarily copies from the DRAM data in all the entries in both regions back to the NAND memory during a DRAM flush when only one of those regions contains updated information. This results in a waste of SSD controller resources, DRAM bandwidth and NAND memory bandwidth. The transfer of this unnecessarily large amount of data spanning two LUT regions also increases the number of program/erase (P/E) cycles on the NAND, which would reduce the life expectancy of the NAND, and lead to increased storage errors associated lifespan shortening.

The present disclosure describes systems and methods to alleviate this problem and improve the efficiency with which a LCA-MCA LUT is updated in the SSD. The present disclosure describes a controller implemented scheme for enhancing the indication of dirty information by the cache memory. Such enhancement is provided by using two or more bits of information per cache line by the cache memory to clearly identify the LUT regions in which an update occurs. With such enhanced notification, cache lines that span two neighboring LUT regions will be clearly marked so that only the LUT region containing the update will be included in the flush to NAND memory.

FIG. 1 is a block diagram of a computing system 100 comprising at least one host 110 in communication with a solid-state device (SSD) 120, according to an embodiment of the present disclosure. The host 110 is a computing system that comprises processors or cores, a controller, a memory, and other components as is generally known in the art, and which are not shown in FIG. 1 for the sake of brevity. SSD 120 provides non-volatile storage functionality for use by the host 110. SSD 120 may include an integrated circuit comprising a controller. Such an integrated circuit may also be referred to as a system-on-chip (SoC) controller 130. SoCs are advantageous in SSDs as they provide a single integrated circuit that contains all the required circuitry and components of the electronic system required for the SSD to function. The SoC therefore eliminates the need for a modular discrete component architecture connected by a plurality of busses and buffers.

SoC controller 130 is communicatively coupled to a storage array of non-volatile semiconductor-based storage devices 140 (such as NAND-based flash memory devices) as the storage medium. The storage medium may comprise a plurality of NAND devices, such as, for example, 32, 64, 128, 256 separate NAND devices, and each NAND device can be running separate commands on individual dies (not shown) within the device. As an example, the storage array 140 comprising n NAND devices each with d dies may be servicing up to (n×d) commands from the SoC controller 130 at any one time, where n and d are integers greater than zero. SSD 120 also includes a volatile memory external to the SoC controller 130, such as a dynamic random access memory ("DRAM") 150. DRAM 150 comprises several buffers (not shown) used to buffer data during read and write operations between the host 110 and the storage devices 140 upon receipt of commands from the host 110.

Volatile memories are used in connection with the controller as they are fast and responsive. However the contents stored in volatile memories are lost when power is removed. Volatile memories are also expensive, and thus increase the overall cost of the SSD. In some implementations, the whole or a part of the external memory DRAM 150 may be located within the SoC controller 130. When located within the SoC controller 130, at least a portion of the external memory may be implemented using a fast memory technology, such as static random access memory (SRAM). In some implementations, the portion of the DRAM located within the SoC 130 may be implemented as a cache 135, as will be described below. In certain implementations, the cache 135 comprises a write-back cache. In further implementations the whole or a part of the external memory may be implemented using a fast non-volatile memory technology, including, but not limited to, magnetic random access memory (MRAM), resistive random access memory (ReRAM) or phase change memory (PCM).

SoC controller 130 comprises a host interface 122 which enables communication with the host 110 for the receipt of commands such as read and write requests, for example. SoC controller 130 also includes a NAND interface 124 for communication with the storage elements 140 (through a plurality of channels such as NAND channels CH1, CH2 ... CHn as shown in FIG. 1, where n is an integer), and a memory interface 126 for communication with the memory 150 external to the SoC. Host interface 122 on the SoC 130 may comprise a Serial Advanced Technology Attachment (SATA) connector or a NVMe™ connector (NVMe™ is an acronym for "NVM express," where "NVM" stands for non-volatile memory, hereinafter NVMe) operating with a PCIe® ("Peripheral Component Interface Express," hereinafter PCIe) bus, for example. NAND interface 124 may comprise an Open NAND Flash Interface (ONFI), a toggle NAND interface or a manufacturer's proprietary interface, for example. Memory interface 126 may comprise, for example, an interface according to, but not limited to: a Double Data Rate (DDR) memory bus standard such as DDR3, DDR4 or DDR5; a Low Power Double Data rate (LPDDR) memory bus standard such as LPDDR3, LPDDR4 or LPDDR5; a Hybrid Memory Cube (HMC) memory bus standard.

SoC controller 130 may comprise various internal sub-controllers such as a NVMe controller 132 coupled to the host interface 122, a memory controller 136 coupled to the memory interface 126 via a cache 135, and a NAND controller 138 coupled to the NAND interface 124. The NVMe controller 132 may be configured to function in accordance with the NVM Express™ Base Specification (version 1.4) dated Jun. 10, 2019, hereinafter referenced as "NVMe 1.4." The NVMe controller 132, L2P engine 134, NAND controller 138 and Memory Controller 136 are interconnected by a common bus and controlled by a control and configuration function (not shown) of the SoC controller 130, which configures and controls the operation and the passing of data between these controllers 132, 136, 138. Memory controller 136 is connected to the DRAM 150 via the memory interface 126. Memory controller 136 is also coupled to the NVMe Controller 132, NAND controller 138 and to the L2P engine via the cache 135. NAND controller 138 is connected to the NAND interface 124 for communication with the storage elements 140, as is shown in FIG. 1. Thus any interaction between the DRAM 150 and the NAND storage elements 140 occurs via the memory interface 126, cache 135, the memory controller 136, the NAND controller 138 and the NAND interface 124. Additionally memory controller 136 is in communication with the NVMe controller 132 and a logical-to-physical (L2P) engine 134, as shown in FIG. 1, and described below. In some implementations, the L2P engine 134 is also implemented in the control and configuration function of the SoC controller 130.

The control and configuration function may comprise application specific integrated circuit (ASIC) logic that is programmable, programmable firmware running on one or more processors or a combination of both. The control and configuration function may comprise a logical-to-physical (L2P) engine 134 that translates logical address information specified in a command received from the host 110 into physical address information related to the NAND memory 140. The control and configuration function may comprise a flash translation layer that enables the SoC controller 130 to perform various activities that facilitate the processing of read and write commands received from the host 110. One such activity may include the orchestration of the data flow for the commands between the NVMe controller 132 and the NAND controller 138.

Once the NVMe controller 132 receives commands from the host 110, such as read commands or write commands, for example, the L2P engine 134 in the control and configuration function maps the logical block addresses contained in the host commands to physical NAND addresses. The L2P engine 134 may utilize a look-up table contained in the cache 135 and/or the DRAM 150 to obtain the required NAND addresses. These NAND addresses are then used in NAND commands, either based on the host commands received or internally generated by firmware, which are sent to the NAND controller 138. The NAND controller 138 uses the NAND addresses to then perform an action or function on the memory device 140, as defined by the host or internal command. For example if the host command is a read command, the NAND controller 138 retrieves data from the specified NAND address in the memory 140, where multiple NAND read commands may be issued to the NAND controller 138 in order to retrieve the data. As another example, if the host command is a write command, the NAND controller 138 causes the writing of host data from the host 110 and/or DRAM 150 to the specified NAND address in the memory 140 as the result of receiving NAND write commands based on the host write command. In yet another example, a garbage collection activity may be internally performed by the control and configuration function within the SoC controller 130 causing multiple read, write and erase NAND commands to be issued to the NAND controller 138 in order to perform a garbage collection function.

Figure 2:
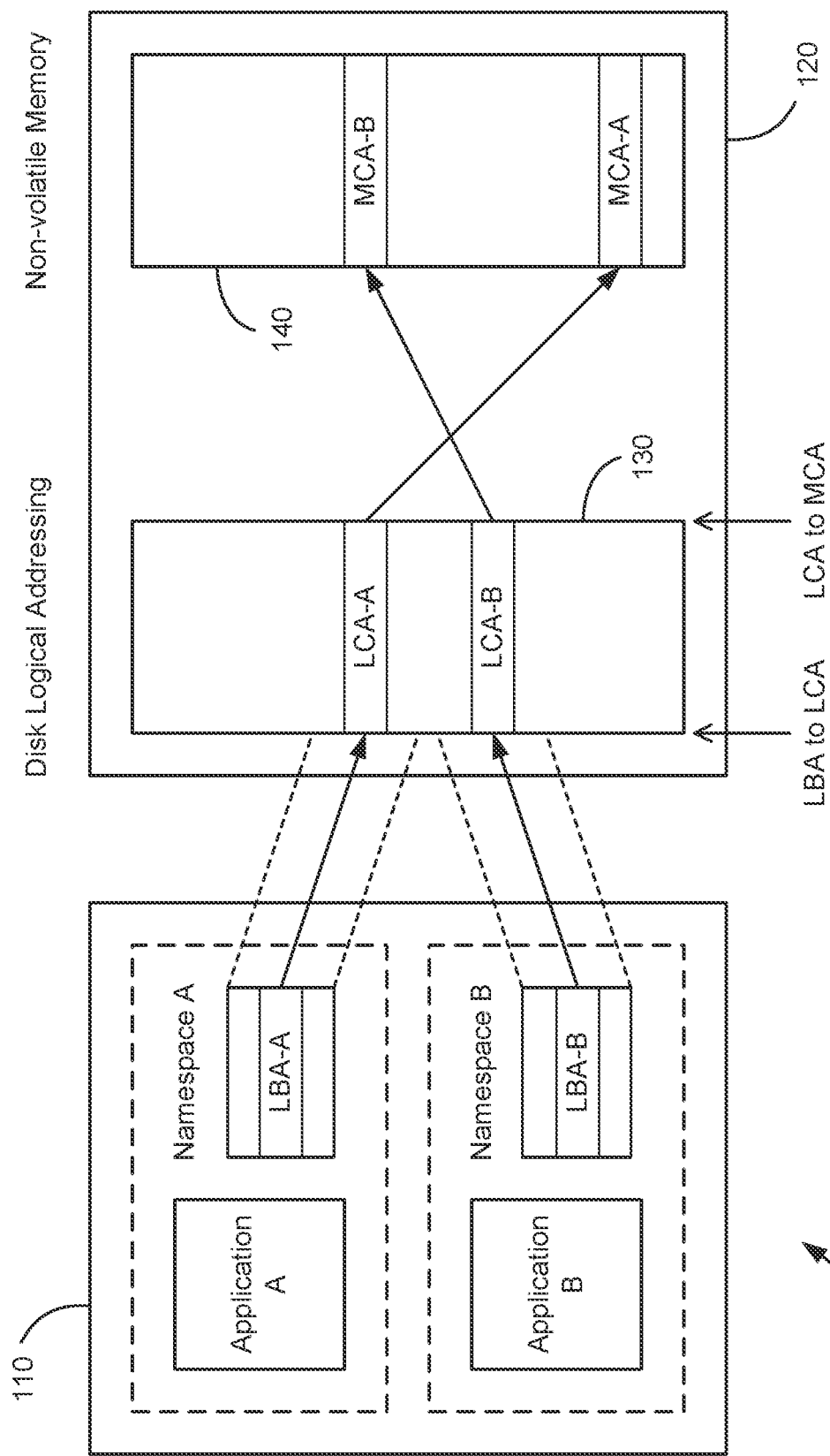
FIG. 2 illustrates the interaction between a host and a controller when the SSD processes a command to be actioned on a non-volatile semiconductor storage device, according to one or more embodiments of the present disclosure.

FIG. 2 illustrates the interaction between the host 110 and the SSD 120 according to an embodiment of the present disclosure. The host 110 is configured to run a plurality of applications, such as Application A and Application B as exemplified in FIG. 2. Applications running on the host 110 generate commands for the SSD 120 to access data stored in the NAND memory 140. Such commands may be read commands or write commands. In order to access specific portions of the NAND memory 140, the host commands contain addressing information which the SSD 120 uses to furnish the request from the host 110. The addressing information provided by the host 110 is with respect to a logical namespace and includes a namespace identifier (NSID) and a Logical Block Address (LBA) within that namespace. The host 110 sends the logical addressing information to the SSD 120 via a host submission queue. The host 110 may use a separate submission queue for each application. When the host commands are received by the SSD 120, the SoC controller 130 maps the namespace-based addressing information (NSID, LBA) to a linear Logical Cluster Address (LCA). While multiple individual applications may interact with namespaces and LBAs individual to that application, the mapping is performed by the SoC controller 130 converts each NSID, LBA addressing information combination to a single LCA value which indexes a common address space. Such mapping is performed by the L2P engine 134 as shown in FIG. 1. In some implementations, the mapping from LBA to LCA is performed algorithmically using a predetermined formula and/or look up tables. In some implementations, the mapping is updated when a namespace is created, deleted or its size is changed.

After the LCA is determined, the L2P engine 134 maps the LCA to a physical location in the NAND memory 140. Each physical location in the NAND memory 140 is defined by a Media Cluster Address (MCA). The length of the MCA depends on the capacity of the SSD 120 (e.g. 33 bits for a 16 TB SSD). Storage of data in the NAND memory array 140 may not be in any particular order, and so there may not be any pre-determined or algorithmic relationship between the LCA and the MCA in SSD 120. The mapping of LCA to MCA is therefore done by accessing a look-up table (LUT) stored in the DRAM 150, but the mapping is not fixed and may be changed by updating entries in the LUT. The LUT stored in the DRAM 150 is a working copy of a master LUT stored in the NAND memory array 140. The LCA is used to index into the LUT to find the MCA entry and for efficiency there is a fixed, algorithmic way to quickly derive the index of an entry in the LUT from the LCA, which implies the entries are preferably of a common size. However, the value of the common size may vary according to the storage size of the NAND memory array 140. In some implementations, the LUT is very large and may be approximately 1/1000th the size of the NAND memory 140. The entries of each LUT region in the DRAM 150 are arranged in order according to LCA, but the LUT regions themselves do not need to be in order. Processing of write commands from the host 110, which may over-write existing data, as well as internal processes such as garbage collection within the SSD 120, may result in the need for reallocation of data stored in the NAND memory 140. Such reallocation of data may result in a change in MCA address associated with an LCA in a host command, thereby leading to frequent updates to the LUT in the DRAM 150 during operation of the SSD 120. The LUT is therefore continually updated when the host commands or activities like garbage collection are processed by the SSD 120.

However as the DRAM 150 is a volatile memory, when the power supplied to the SSD 120 is removed, e.g. when the SSD 120 is shut down, the contents of the DRAM 150 are lost. This is disadvantageous as the LUT would no longer be available to map an LCA address received from a host to a physical MCA address within the NAND memory 140, thereby leading to errors when processing host commands. Further, due to the large size of the LUT in the DRAM 150, copying the entire LUT to another portion of the SSD 120, such as to a portion of the NAND memory 140, may not be possible in the short time from when the power is removed from the SSD 120 to when data is lost from the DRAM 150.

According to an embodiment of the present disclosure, there is provided an SSD 120 in which the LUT is initially stored in a portion of the NAND memory 140, which is a non-volatile memory that retains data even when power is removed. The LUT in the NAND memory 140 is subsequently loaded or copied to the DRAM 150 on startup for quick access by the SoC 130, in particular the L2P engine 134 and the cache 135, when processing host commands. As such, the copy of the LUT in NAND memory is a master copy and the LUT in DRAM is a working copy. In some implementations, there may be multiple master copies of the LUT in NAND in order to protect against errors or failures of NAND dies or devices. Additionally, in accordance with further embodiments of the present disclosure, as the entries in the working copy of the LUT in the DRAM 150 are updated when the SoC controller 130 processes host commands or internal commands (e.g. produced by internal garbage collection processes), the updated entries in the LUT are flushed or copied from the LUT in the DRAM 150 to the master copy (or copies) of the LUT in NAND memory 140 to replace their original values at some time after the update in the DRAM 150 occurs. This ensures that the master copy (or copies) of the LUT stored in the NAND memory 140 contains the most recent and up to date mapping of LCA to MCA in the SSD 120. In this manner, should there be a power loss event (e.g. due to a power cut or failure of a power supply), the most recently updated LUT in the NAND memory 140 can be used to initialize the DRAM 150 when the SSD 120 starts up again. In some implementations, when a power loss event is detected, a backup power source (e.g. supercapacitors or batteries) is used to provide enough power such that any updates not yet flushed from the LUT in DRAM 150 to the master copy (or copies) in NAND memory can be included in a final flush from DRAM 150 to NAND memory 140 before the SSD is shut down gracefully. In accordance with yet another embodiment of the present disclosure, the updates to the LUT from the DRAM 150 to the NAND memory 140 are enhanced and optimized such that only regions of the LUT containing an actual updated entry are copied from the DRAM 150 to the NAND memory 140. The improves the efficiency of the SSD 120 as there is no wastage of DRAM bandwidth or NAND memory bandwidth as no unnecessary data is included in the flush from DRAM 150 to NAND memory 140 (or in a final flush from DRAM 150 to NAND memory 140 in the event of a power loss event). This also reduces the number of program and erase (P/E) cycles performed by the NAND memory 140 thereby extending its lifespan.

Figure 3:
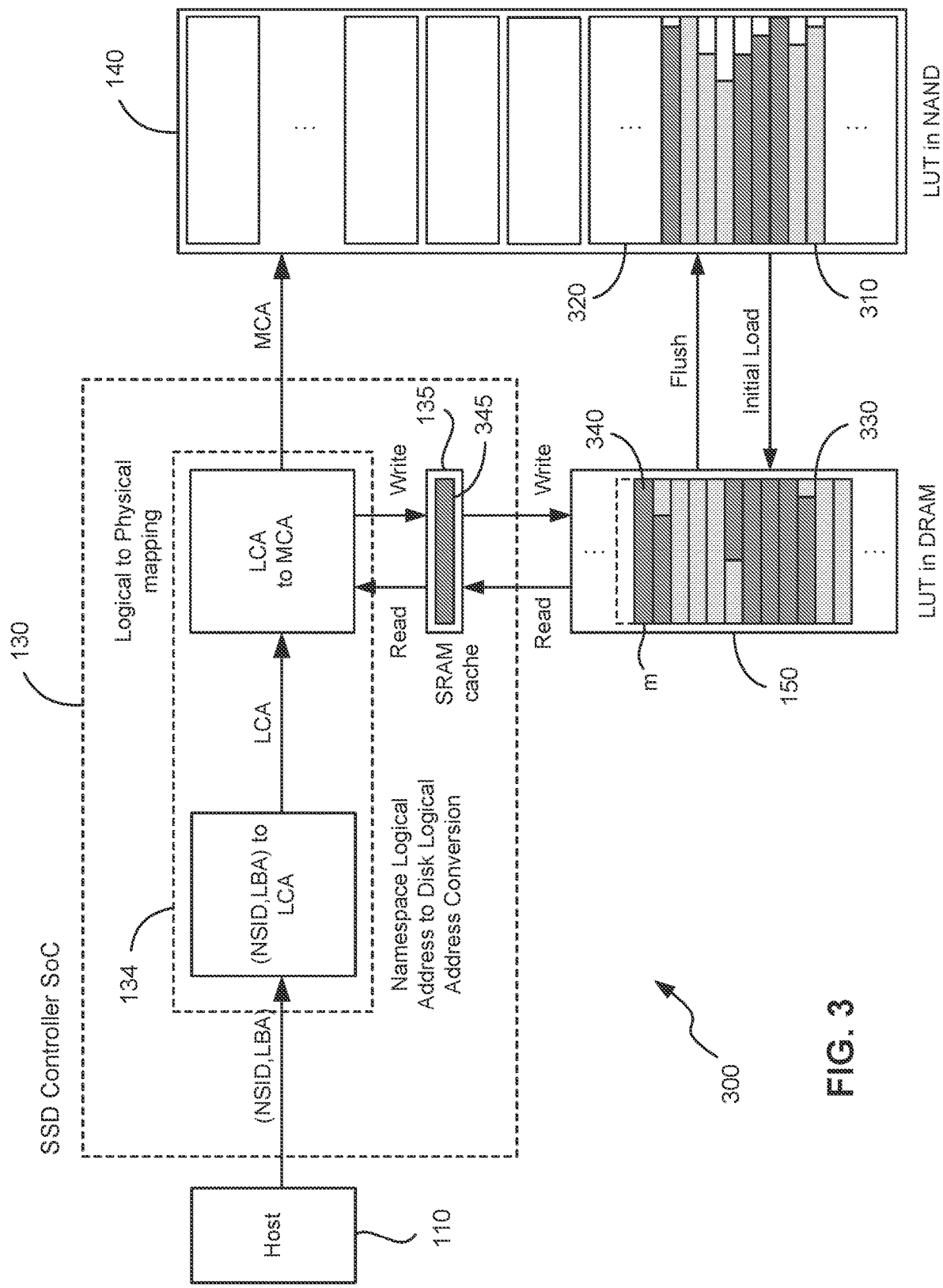
FIG. 3 illustrates the interaction between a host and a controller where the Logical Cluster Address (LCA) to Media Cluster Address (MCA) look-up table (LUT) is initially stored in the non-volatile memory device, according to one or more embodiments of the present disclosure.

FIG. 3 illustrates the interaction between the host 110 and the SSD 120 in FIG. 1. Specifically, FIG. 3 shows the internal flow of data within the SSD 120 after the host 110 issues a command. As previously described, the host 110 issues commands (e.g. a read command or a write command) to the SSD 120 to gain access to the NAND memory 140 and the data contained therein. A host command comprises at least an NSID and an LBA. Upon receipt of the logical addressing information (NSID, LBA) from the host 110, the SoC controller 130 converts the NSID and LBA combination to an LCA. Such conversion may be done algorithmically by the L2P engine 134. The L2P engine 134 uses the LCA to index into a LCA-MCA LUT to generate the MCA within the NAND memory 140 that is targeted by the host 110 (either for the writing of data to the NAND memory 140 in the case of a host write command, or for the retrieval of data from the NAND memory 140 in the case of a host read command).

The LCA-MCA LUT is a large table and is stored in the DRAM 150 for quick access by the SoC controller 130. According to embodiments of the present disclosure, the LCA-MCA LUT 310 is initially stored in a portion 320 of the NAND memory 140 as shown in FIG. 3. At startup of the SSD 120, LUT 310 is loaded into the DRAM 150. As the LUT in the NAND memory 140 is not aligned to the DRAM burst boundary (the DRAM 150 has a shorter line width than the NAND memory 140), the LUT 310 may be rearranged into an LUT 330 having a unit of storage (i.e. a NAND memory page vs. a DRAM burst length) different to LUT 310 when loaded into the DRAM 150. Also LUT 330 in DRAM 150 may be packed differently than LUT 310 in the NAND memory 140. It should be noted that the LCA and MCA LUT entries in LUT 310 and LUT 330 are the same during the initial load from NAND memory 140 to DRAM 150, the original entries of the LUT 310 have just been rearranged in LUT 330. Once the LUT 330 is loaded into the DRAM 150, the SoC controller 130 triggers DRAM bursts as it processes commands (host commands or internally generated commands). Each DRAM burst causes an entire cache line's worth of data in the DRAM 150 to be read into the cache 135. This is because all accesses to the LCA to MCA mapping as defined in LUT 310 is done via the cache 135 to ensure coherency of the LCA to MCA mapping in the LUT 310. It should be understood that the cache line boundaries of the cache 135 and the boundaries of the minimum data burst of the DRAM 150 are aligned (at 64 bytes for DDR5 technology), and so no reconfiguration of the LUT entries between the DRAM 150 and the cache 135 is necessary. As shown in FIG. 3, LUT entries 340 stored at an address of the DRAM 150 (e.g. at address m, where m is an integer, in units of the DRAM burst size) have been read as a DRAM burst into the cache 135 (as cache line 345) after the SoC controller 130 triggers a DRAM burst.

The LUT entries in the cache 135 are then read by the L2P engine 134 to convert an LCA to an MCA when processing a command. As previously described, the processing of host commands by the SoC controller 130 may cause the allocation/reallocation of data to a location in the NAND memory 140. Typically, this will take place for write commands, but in the case of read commands, only reads of the LCA to MCA table are generally required. In some cases, reading may cause NAND memory read disturb limits to be exceeded, where memory pages may need to be refreshed (re-written to a different location), but this generally takes place as a separate background activity conducted by the control and configuration function of the SoC controller 130. Allocation/reallocation may cause rearrangement of data in the NAND memory, and thus the update/insertion/deletion of entries to/from the original LCA-MCA LUT 310. In addition, the SoC controller 130 may also process internal commands, such as those for garbage collection, which will move valid data stored in the NAND memory from one location to another location. This causes deallocation and subsequent reallocation of resources within the NAND memory 140, and hence an update to at least one entry in the original LCA-MCA LUT 310. As cache 135 is a write-back cache, such updates are first written to cache line 345 in the cache 130 by the L2P engine 134 of the SoC controller 130. It should be noted that the L2P engine 134 only updates one LCA-MCA entry in the cache 135 at any one time. The L2P engine also includes some sideband information with each update to indicate the position of the update amongst the LUT entries 340. After the L2P engine 134 writes to the cache, a write via a DRAM burst to address m of the DRAM (from which the LUT entries in cache line 345 originated) occurs. The SoC controller 130 is notified of the existence of an updated entry at address m of the DRAM, and, together with the sideband information, determines an MCA start address of an LUT region in the original LUT 310 that has been updated. In some implementations, this may be done via a second LUT stored in the NAND memory 140 which maps LUT region indexes to MCA start addresses. The SoC controller 130 then triggers a flush of the LUT region from LUT 330 in the DRAM 150 to LUT 310 stored in the NAND memory 140 where the region in which the original LCA-MCA entry was located is replaced. While FIG. 3 shows a double arrow between the DRAM 150 and the NAND memory 140, it should be noted that any interaction between the DRAM 150 and the NAND memory 140 occurs via the memory interface 126, the memory controller 136, the NAND controller 138 and the NAND interface 124.

Figure 4:
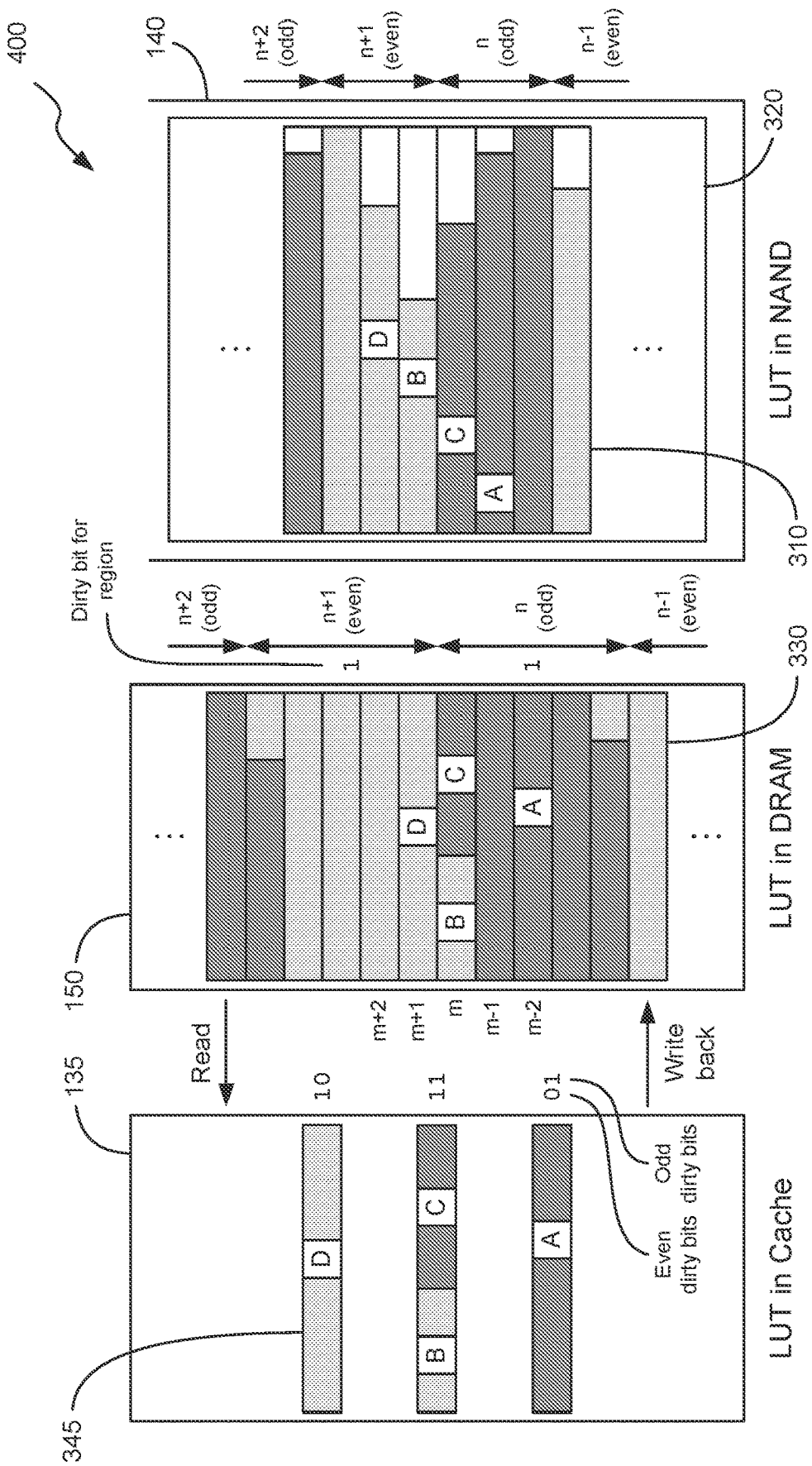
FIG. 4 illustrates an exemplary LCA-MCA LUT as arranged in the NAND memory and as reconfigured in the DRAM, according to one or more embodiments of the present disclosure.

FIG. 4 illustrates the arrangement of LCA-MCA LUT 310 and LCA-MCA LUT 330 as stored in a portion 320 of the NAND memory 140, and in the DRAM 150, respectively. FIG. 4 also shows data from several cache lines 345 as contained in the cache 135 that contain updated entries A, B, C and D of the LCA-MCA LUT 330. Note that each of the cache lines 345 would be read back from the cache 135 to the DRAM 150 separately. In FIG. 4 the regions of the LUT 310 are alternately termed 'even' regions and 'odd' regions, each incremented/decremented from an index n, where n is an integer. In some implementations, each region of LUT 310 comprises 64 LCA-MCA entries. As previously described, the LCA-MCA LUT 310 is initially saved in a portion 320 of the NAND memory 140, and is loaded or copied into the DRAM 150 at startup. When LUT 310 is copied to DRAM 150, some reconfiguration occurs as the DRAM burst boundaries are not aligned with the NAND memory 140 (the DRAM burst size of the DRAM 150 may be much smaller than the memory page size of the NAND memory 140—for example 64 bytes vs. 16 Kbytes). Additionally, there may be a different type of ECC with a different number of ECC bits used with the LUT entries in the DRAM 150 vs. the NAND memory 140. The reconfiguration of LUT 310 results in LUT 330 in the DRAM 150, with LUT regions packed into the DRAM burst aligned framework of the DRAM 150. This results in some of the DRAM address lines having LUT entries from two regions, such as DRAM address m where the 'odd' region n ends, and the 'even' region n+1 starts, in the middle the address line, as shown in FIG. 4.

Once the DRAM 150 receives updated LUT entries from the cache 135, the SoC controller 130 flushes regions in the LUT 330 containing updated LUT entries to the NAND memory 140 so that the LUT 310 can be updated with the new LCA-MCA addressing information. It may be important for the SoC controller 130 to identify the specific location within the DRAM 150 that contains an update in order to flush only that region containing the update. In accordance with embodiments of the present disclosure, sideband information comprising two dirty bits are assigned to each cache line 345 by the cache controller (not shown) of the cache 135. The dirty bits themselves may not be stored in the DRAM 150. The two dirty bits serve to identify the LUT region within a cache line 345 in which an update occurs. One dirty bit is assigned as an even dirty bit and one dirty bit is assigned as odd dirty bit. When an update occurs, a dirty bit is set to a dirty state or '1' to indicate to the cache controller of the cache 135 that the respective (odd or even) LUT region contains updated information. Each dirty bit is independent, but if an update to a cache line 345 occurs which spans two LUT region changes (one odd and one even) that changes the data in both the odd and even LUT regions associated with that cache line 345, then both the odd and even dirty bits are set to a dirty state or '1'. If no update occurs, the dirty bit remains in the clean state or '0' to indicate to the SoC controller 130 that no updates are present in the respective (odd or even) LUT region. Note that as each data burst from the DRAM 150 is read into the cache, the dirty bits are initially set to the clean state or '0' before updates are written to any of the LUT entries in the cache line 345 of the cache 135.

For example, LUT 330 in DRAM 150 shown in FIG. 4 has four updated entries A, B, C and D from cache 135. Note that each of these updates have been written separately in the cache 135 as the SoC controller 130 processes commands and have been written back to the DRAM 150. Updated entries A, B, C and D have accumulated since the last flush to NAND memory 140. Update A has occurred in an entry at DRAM address m−2 in 'odd' region n. Update B and C have both occurred in DRAM address m, with update B being in 'even' LUT region n+1, and update C being in 'odd' LUT region n. Update D has occurred in DRAM address m+1 in 'even' LUT region n+1. Thus the dirty bits for the cache lines 345 written back to DRAM addresses m−2, m and m+1 are set to '01', '11' and '10' respectively, as shown in FIG. 4. Upon instruction by the SoC controller 130, regions having entries in LUT 330 containing dirty bits set to '1' are copied over the NAND memory 140. In the example shown in FIG. 4, 'odd' region n and 'even' region n+1 are copied over to replace the corresponding entries in the LUT 310 stored in the NAND memory 140. In both regions n and n+1, a respective dirty bit is set to '1', as shown in FIG. 4. It will be understood that as the LUT 310 in the NAND memory 140 is updated as the updates become available from the DRAM 150, the LCA-MCA entries in the LUT 310 stored in the NAND memory 140 are not arranged in any order. The use of two dirty bits enhances the process of updating the LUT 310 in the NAND memory 140 in cases where one region is updated, as will be described in relation to FIGS. 5A and 5B.

Figure 5A:
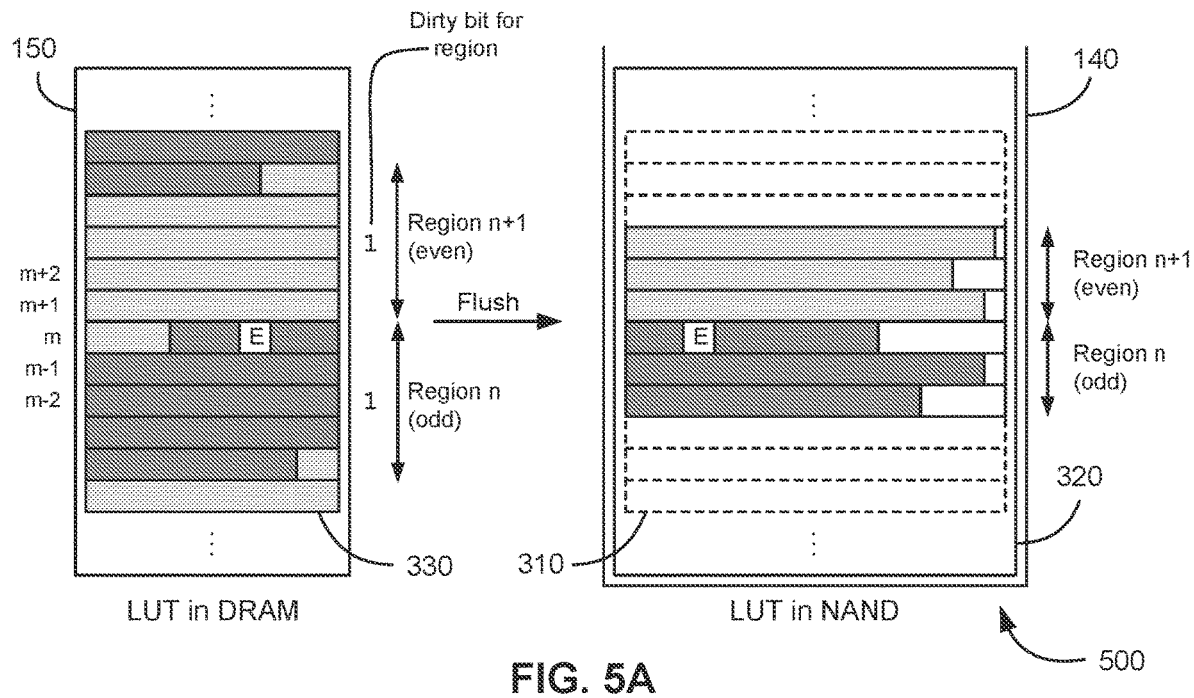
FIG. 5A illustrates an example of updating a single entry in the LUT using a single dirty bit as cache notification.
Figure 5B:
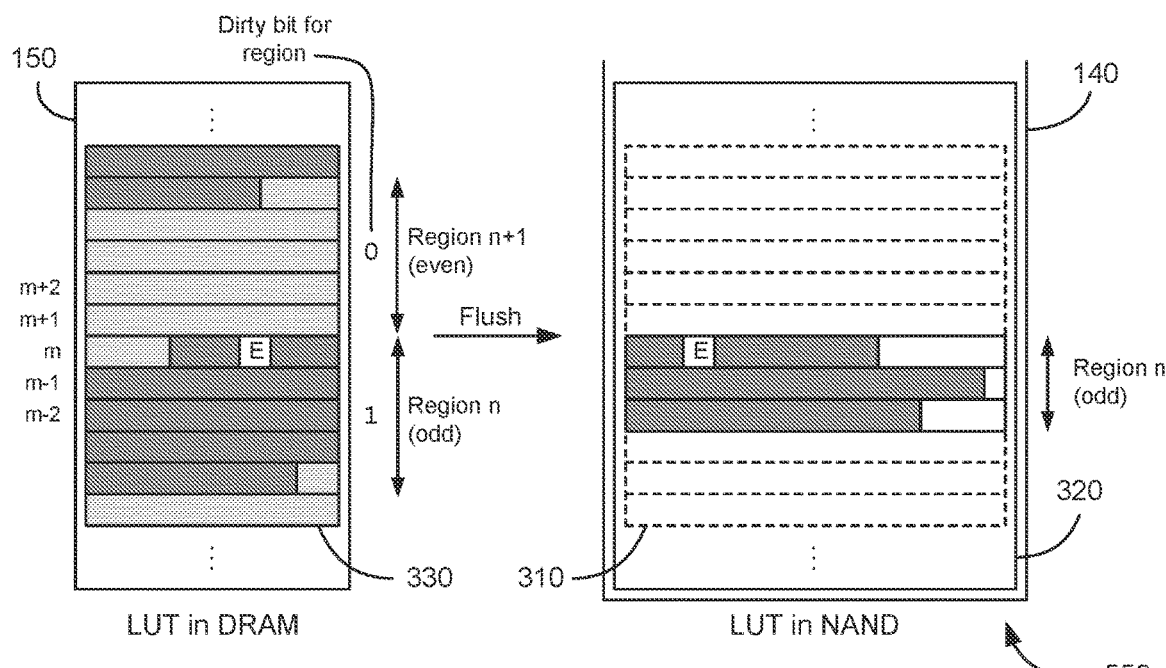
FIG. 5B illustrates an example of updating a single entry in the LUT using a pair of dirty bits as cache notification, according to one or more embodiments of the present disclosure.

FIGS. 5A and 5B illustrate the arrangement of LCA-MCA LUT 310 and LCA-MCA LUT 330 as stored in a portion 320 of the NAND memory 140, and in the DRAM 150, respectively. In LUT 330, only one entry E has been updated in the cache 150. Updated entry E belongs to 'odd' region n and is stored at address m in DRAM 150. However address m of the DRAM 150 also stores LCA-MCA LUT entries belonging to 'even' region n+1. This is shown in FIGS. 5A and 5B where horizontal address m in DRAM 150 contains a light grey and a dark grey shaded area. In FIG. 5A, the L2P engine 134 of the SoC controller 130 assigns a single dirty bit as sideband information to each corresponding cache line 345. Thus after being updated in the cache 135, the dirty bit assigned to the cache line 345 corresponding to address m of the DRAM 150 containing updated LCA-MCA LUT entry E is set to a dirty status of '1' and the cache line data is copied to address m of the DRAM 150. When this occurs the SoC controller 130 scans the dirty bits for each of the address lines in the DRAM 150 and identifies those that are set to the dirty status, and the corresponding LUT region or regions that should be flushed. The SoC controller 130 then triggers a flush of the LUT region or regions from DRAM 150 to the NAND memory 140.

In the example shown in FIG. 5A, the SoC controller 130 would identify address m as having its dirty bit set to '1' indicating the existence of updated entry E. However, address m of the DRAM 150 contains entries belonging 'even' region n+1 and 'odd' region n. The single dirty bit merely identifies the DRAM address line containing the updated entry, but the granularity of this indication provides no information as to whether the update in address m belongs to region n+1 or region n. Such information is important as the LUT 310 stored in the NAND memory 140 is updated according to regions in the NAND memory 140 and not individual addresses of the DRAM 150. As such, the SoC controller 130 sets the dirty bit for the regions n and n+1 to '1'. The SoC controller 130 then flushes LUT entries belonging to both regions n and n+1 to the NAND memory 140. As can be seen in FIG. 5A, the flush of LUT entries in region n+1 was unnecessary as it contained no updated information. However assigning only a single dirty bit by the L2P engine 134 as sideband information to each cache line 345 does not provide the SoC controller 130 with sufficient information to decipher which of region n, region n+1, or both, contained updated information. Such unnecessary transfer of information wastes DRAM bandwidth, wastes NAND memory bandwidth, and increases the number of P/E cycles on the NAND memory 140.

In accordance with an embodiment of the present disclosure, the L2P engine 134 assigns two dirty bits as sideband information to each cache line 345, as exemplified in FIG. 5B. After being updated in the cache 135, the dirty bits in the cache line 345 associated with address m of the DRAM 150 containing updated LCA-MCA LUT entry E in 'odd' region n are set to '01'. The status of these dirty bits indicates that address m of the DRAM 150 contains no updated entries in 'even' region n+1 and contains an updated entry (E) in 'odd' region n. Accordingly, the SoC controller 130 sets the dirty bit for the region n to '1', and maintains the dirty bit for region n+1 at '0'. The SoC controller 130 is notified of the existence of an updated entry at DRAM address m in 'odd' region n only, and determines an MCA start address of LUT region n in the NAND memory 140. In some implementations, this may be done via a second LUT stored in the NAND memory 140 which maps each LUT region index (e.g. indexes n−1, n, n+1) to an MCA start address in the NAND memory 140. The SoC controller 130 then flushes LUT entries belonging to region n only to the NAND memory 140.

As can be clearly seen from FIGS. 5A and 5B, the increased granularity provided by the two dirty bits enables the SoC controller to specifically determine the LUT region that contains the updated entry, thereby resulting in LUT entries in only the relevant region being flushed to the NAND memory 140. This increases the DRAM bandwidth, increases the NAND memory bandwidth, and decreases the number of P/E cycles on the NAND memory 140, thereby conserving resources and enhancing the performance of the SSD 120.

Figure 6:
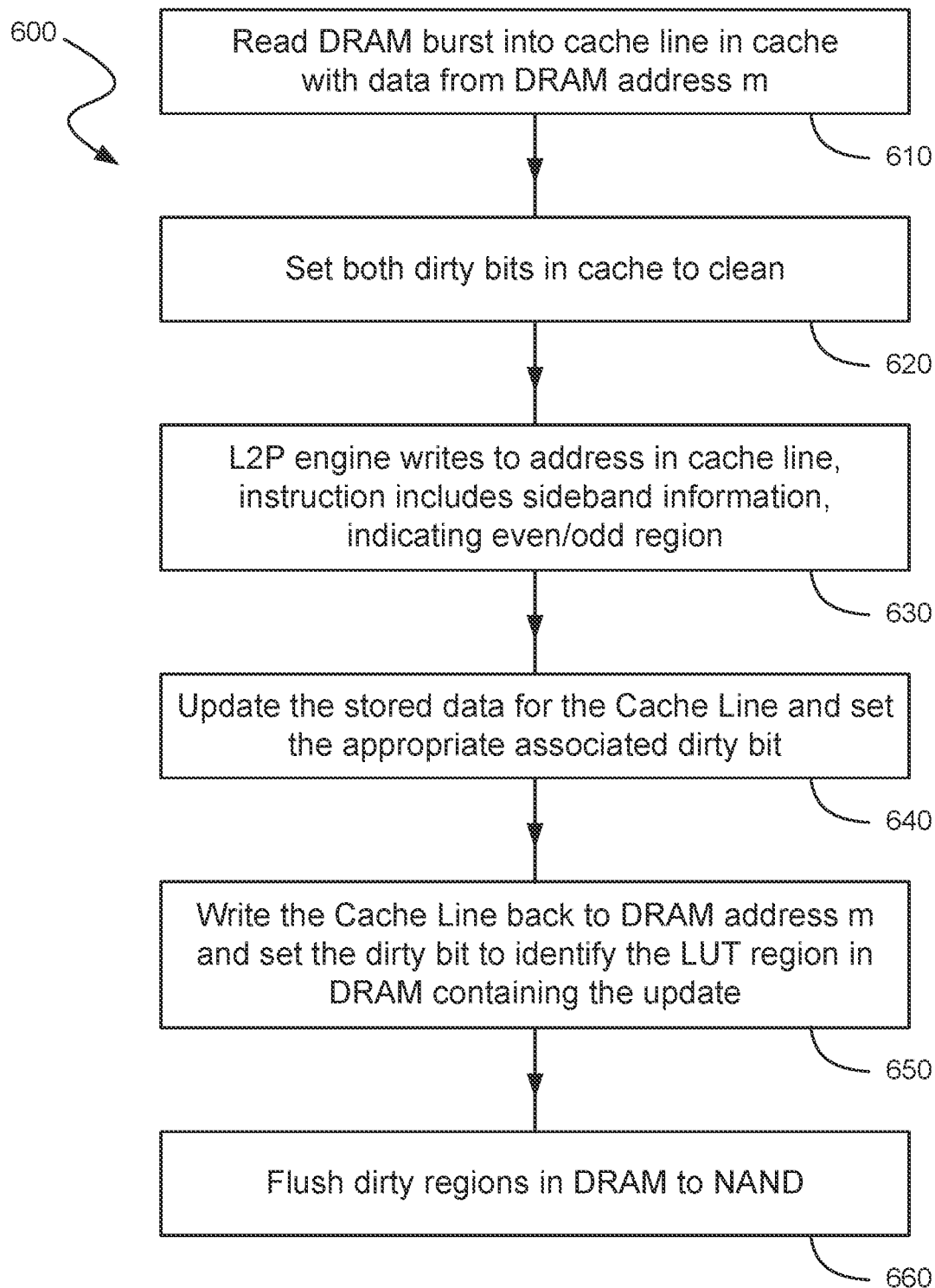
FIG. 6 is a flow diagram of a method for updating an LCA-MCA LUT stored in a non-volatile semiconductor storage device, according to one or more embodiments of the present disclosure.

FIG. 6 illustrates an exemplary flow diagram of a method 600 for updating a LUT stored in a NAND memory, according to an embodiment of the present disclosure. The method may be carried out with the SSD 120 as described in the foregoing. The LUT may comprise an LCA to MCA LUT. Method 600 assumes a LCA-MCA LUT initially stored in a non-volatile memory, such as NAND memory 140, has been copied to a volatile memory, such as DRAM 150, on startup of the SSD 120. The DRAM burst size may be different to the NAND flash memory page size of the NAND memory 140 and a different number of ECC bits may be appended when storing data in DRAM 150 or NAND memory 140, resulting in a reconfiguration of the LUT when it is loaded from the NAND memory 140 to the DRAM 150. This results in DRAM addresses that span either an even LUT region, and odd LUT region, or both, as shown in FIGS. 3 and 4 as described in the foregoing.

The method 600 for updating the LUT begins at step 610 where a DRAM burst is read into the cache line 345 of the cache 135, where LUT entries from the DRAM 150 at address m are copied into the cache line 345 of the cache 135. The cache 135 may comprise a write-back cache. The method then proceeds to step 620 where the SoC controller 130 assigns two dirty bits to each cache line 345 of the cache 135, where one dirty bit is assigned to entries belonging to an 'even' region of the LUT, and the other dirty bit is assigned to entries belonging to an 'odd' region of the LUT. Initially, the SoC controller 130 sets both dirty bits to clean, or '0'.

In step 630, the L2P engine 134 writes to an address in the cache line 345. The LUT entries in cache line 345 of the cache 135 are then updated as commands (such a host write commands or internally generated commands) are processed by the L2P engine 134 of the SoC controller 130 (step 640). The SoC 130 updates the LCA-MCA entries in the cache line 345 of the cache 135 by writing to the cache 135 as data gets allocated/reallocated in the NAND memory 140 when processing commands. When updating the entries in the cache line 345, the L2P engine 134 provides the cache 135 with sideband information on each write to indicate whether the updated entry is in an odd or even region of the LUT. Accordingly, the SoC controller 130 sets a bit of the pair of dirty bits in the cache 135 to '1' if the LUT entry has been updated where the pair of bits is set to '10' if the updated entry in the cache 135 belongs to an 'even' region in the LUT, to '01' if the updated entry in the cache 135 belongs to an 'odd' region in the LUT, to '11' if the cache 135 contains updated entries that belong to both 'even' and 'odd' regions in the LUT, or maintains the dirty bits at '00' if not updated information has been written to the cache 135.

Next in step 650, the SoC controller 130 may trigger a DRAM burst to write the contents of the cache line 345 of the cache 135 back to the DRAM address m from which they were initially loaded. Once the contents of the cache 135 is written back to the DRAM 150, the SoC controller 130 utilizes the information from the dirty bits in the cache 135 to determine the region n in the LUT that contains the updated entry. Here the SoC controller 130 may set a bit to '1' in the DRAM to identify the respective LUT regions that contain updated entries. The SoC controller 130 may also determine an MCA start address of a corresponding LUT region n in the NAND memory 140. In some implementations, this may be done via a second LUT stored in the NAND memory 140 which maps each LUT region index (e.g. indexes n−1, n, n+1 as described in the foregoing) to an MCA start address in the NAND memory 140.

The method then progresses to step 660 where the SoC controller 130 flushes or writes the entries belonging to LUT region n (identified by the set bit '1') containing the updated entry to the NAND memory 140. The increased granularity provided by the two dirty bits used in method 600 enables the SoC controller to specifically determine the LUT region that contains the updated entry, thereby resulting in LUT entries in only the relevant region being flushed to the NAND memory 140, as described above in relation to FIGS. 5A and 5B. This increases the DRAM bandwidth, increases the NAND memory bandwidth, and decreases the number of P/E cycles on the NAND memory 140, thereby conserving resources and enhancing the performance of the SSD 120.

In the foregoing, all recitation of "layer" and "engine" should be taken to mean a plurality of circuits within the controller that facilitates the function as described. Such circuits may comprise electronic components formed on a semiconductor chip, such as, for example, transistors and resistors. It should be noted that the term "about" or "approximately" in the foregoing indicates a range of ±20% of the stated value. Additionally, in the foregoing, all recitation of "command," "action" or "function" should be taken to be based on algorithms and instructions stored on a non-transitory computer-readable medium, that, when executed by a processor, causes a controller of an integrated circuit of a solid-stated drive (SSD) to perform the command, action or function.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

The invention claimed is:

1. A memory storage system external to a host, the memory storage system comprising:
    a non-volatile semiconductor memory device configured to store a look-up table (LUT) comprising entries;
    a volatile semiconductor memory device configured to temporarily store the entries of the LUT; and
    a controller configured to store and retrieve data in the non-volatile semiconductor memory device in response to commands received from the host external to the memory storage system, the controller configured to:
        assign a status indicator to each of a plurality of first regions in the LUT and a plurality of second regions in the LUT, the status indicator corresponding to one or more entries of a cached address of the volatile semiconductor memory device belonging to the first region or the second region of the LUT,
        update one or more status indicators, each an updated status indicator, and
        copy, based on the updated one or more status indicators, the one or more entries in the volatile semiconductor memory device associated with either the first region or the second region containing the updated status indicator to the non-volatile semiconductor memory device.

2. The memory storage system of claim 1, further comprising:
    a cache line communicatively coupled to the volatile semiconductor memory device and configured to temporarily store the one or more entries read from an address of the volatile semiconductor device.

3. The memory storage system of claim 2, wherein the controller is further configured to:
    update an entry of the LUT in the volatile semiconductor memory device read into the cache line.

4. The memory storage system of claim 3, wherein the controller is further configured to:
    set the status indicator to a dirty status based on whether the updated entry in the volatile semiconductor memory is in the first region or the second region of the LUT, respectively.

5. The memory storage system of claim 3, wherein the controller is further configured to:
    read the entry of the LUT at an address in the volatile semiconductor memory device to the cache line; and
    write the cache line back to the address in the volatile semiconductor memory device.

6. The memory storage system of claim 1, wherein the controller is configured to update only one entry of the LUT in the cache line at a time.

7. The memory storage system of claim 1, wherein the controller is configured to repeatedly update one or more entries of the LUT in the volatile semiconductor memory device via the cache line based on commands received from the host.

8. The memory storage system of claim 1, wherein the LUT maps a logical cluster address (LCA) to a media cluster address (MCA) in the non-volatile semiconductor memory device.

9. The memory storage system of claim 1, wherein the non-volatile semiconductor memory device is configured to store a second LUT which maps an index associated with each of the plurality of first regions and the plurality of second regions to a media cluster address (MCA) in the non-volatile semiconductor memory device.

10. The memory storage system of claim 9, wherein the controller is further configured to:
    access the second LUT to determine a starting MCA address of the region containing the updated entry in the non-volatile semiconductor memory device.

11. The memory storage system of claim 1, wherein the controller is further configured to:
    copy the LUT from the non-volatile semiconductor memory device to the volatile semiconductor memory device when the memory storage system first starts up.

12. The memory storage system of claim 1, wherein the status indicator comprises a bit.

13. The memory storage system of claim 12, wherein the bit is set to a clean status before the entry of the LUT at the address of the volatile semiconductor memory device is updated in the cache line.

14. The memory storage system of claim 13, wherein the controller sets the bit to '0' for the clean status, and sets the bit to '1' for the dirty status.

15. The memory storage system of claim 1, wherein the cache line comprises a write back cache line.

16. The memory storage system of claim 1, wherein the cache line is formed in a portion of the volatile semiconductor memory device.

17. A method performed by a controller of a memory storage system, the memory storage system being external to a host and comprising a non-volatile semiconductor memory device configured to store a look-up table (LUT) comprising entries, a volatile semiconductor memory device configured to temporarily store the entries of the LUT, the method comprising the steps of:
    assigning a status indicator to each of a plurality of first regions in the LUT and a plurality of second regions in the LUT, the status indicator corresponding to one or more entries of a cached address of the volatile semiconductor memory device belonging to the first region or the second region of the LUT;
    updating one or more status indicators, each an updated status indicator, and
    copying, based on the updated one or more status indicators, the one or more entries in the volatile semiconductor memory device associated with either the first region or the second region containing the updated status indicator to the non-volatile semiconductor memory device.

18. The method of claim 17, further comprising the step of:
    storing, temporarily, in a cache line communicatively coupled to the volatile semiconductor memory device the one or more entries read from an address of the volatile semiconductor device.

19. The method of claim 17, further comprising the steps of:
    updating an entry of the LUT in the volatile semiconductor memory device read into the cache line.

20. The method of claim 19, further comprising the steps of:
    setting the status indicator to a dirty status based on whether the updated entry in the volatile semiconductor memory is in the first region or the second region of the LUT, respectively.

21. The method of claim 17, further comprising the steps of:
    reading the entry of the LUT at an address in the volatile semiconductor memory device to the cache line; and
    writing the cache line back to the address in the volatile semiconductor memory device.

22. The method of claim 17, wherein the step of updating is performed on only one entry of the LUT in the cache line at a time.

23. The method of claim 17, wherein the step of updating is performed repeatedly based on commands received from the host.

24. The method of claim 17, wherein the LUT maps a logical cluster address (LCA) to a media cluster address (MCA) in the non-volatile semiconductor memory device.

25. The method of claim 17, wherein the non-volatile semiconductor memory device is configured to store a second LUT which maps an index associated with each of the plurality of first regions and the plurality of second regions to a media cluster address (MCA) in the non-volatile semiconductor memory device.

26. The method of claim 25, further comprising the step of:
    accessing the second LUT to determine a starting MCA address of the region containing the updated entry in the non-volatile semiconductor memory device.

27. The method of claim 17, further comprising the step of:
    copying the LUT from the non-volatile semiconductor memory device to the volatile semiconductor memory device when the SSD first starts up.

28. The method of claim 17, wherein the status indicator comprises a bit.

29. The method of claim 28, further comprising the step of:
    setting each bit to a clean status before the entry of the LUT at the address of the volatile semiconductor memory device is updated in the cache line.

30. The method of claim 29, wherein setting a bit to the clean status comprises setting the bit to '0', and setting a bit to the dirty status comprises setting the bit to '1'.

* * * * *